United States Patent [19]
Schreck

[11] Patent Number: 5,513,064
[45] Date of Patent: Apr. 30, 1996

[54] METHOD AND DEVICE FOR IMPROVING I/O ESD TOLERANCE

[75] Inventor: John F. Schreck, Houston, Tex.

[73] Assignee: Texas Instruments Incoprorated, Dalls, Tex.

[21] Appl. No.: 401,040

[22] Filed: Mar. 6, 1995

Related U.S. Application Data

[63] Continuation of Ser. No. 229,066, Apr. 18, 1994, abandoned, which is a continuation of Ser. No. 806,525, Dec. 13, 1991, abandoned.

[51] Int. Cl.[6] .................................................. H02H 9/06
[52] U.S. Cl. ................................. 361/250; 361/111
[58] Field of Search ............................ 361/91, 56, 58, 361/111

[56] References Cited

U.S. PATENT DOCUMENTS

| | | | |
|---|---|---|---|
| 3,947,727 | 3/1976 | Stewart | 361/91 |
| 4,868,705 | 9/1989 | Shiochi et al. | 361/91 |
| 4,930,037 | 5/1990 | Woo | 361/58 |

*Primary Examiner*—Todd Deboer
*Attorney, Agent, or Firm*—Ronald O. Neerings; Theodore D. Lindgren; Richard L. Donaldson

[57] ABSTRACT

An input protection device is presented for improving I/O electrostatic discharge ESD tolerance. The present invention protects a selected device by providing a sufficient potential difference between the substrate and the source of the device in question to protect it against an electrostatic discharge. In one embodiment of the invention, a resistor is placed between the substrate and the internal $V_{SS}$ connection. All $V_{SS}$ to substrate contacts have to be removed for internal $V_{SS}$ busses to be maintained at a predetermined resistance between the substrate and $V_{SS}$. In other embodiments of the invention, an active device is placed between the substrate and the internal $V_{SS}$ connection. As with the first described embodiment, all $V_{SS}$ to substrate contacts have to be removed for internal $V_{SS}$ busses to be maintained at a predetermined resistance between the substrate and $V_{SS}$. The active device presents a high impedance when not powered on and is very conductive when powered on.

3 Claims, 2 Drawing Sheets

METHOD AND DEVICE FOR IMPROVING I/O ESD TOLERANCE

This application is a continuation of application Ser. No. 08/229,066, filed Apr. 18, 1994, which is a continuation of Ser. No. 07/806,525, filed Dec. 13, 1991 both abandoned.

FIELD OF THE INVENTION

The present invention relates to the field of input protection circuitry for sensitive electrical devices. More specifically, the present invention relates to the field of protection of VLSI circuitry in over-voltage conditions such as electrostatic discharge situations.

BACKGROUND OF THE INVENTION

Input protection circuitry is an essential part of modern integrated circuits, particularly in the area of field effect transistor based devices. Extremely small delicate device structures are very sensitive to high voltages. The threat of high voltage damage begins during fabrication of integrated circuits, exists during installation of integrated circuits into products and continues throughout the service life of the integrated circuits.

High voltage damage from electrostatic discharge may occur during installation of integrated circuits into products. Sources of electrostatic charge include the human body, within which charge is generated, and installation tools having residual charge. Electrostatic charge may be transferred to integrated circuits through physical contact. Subsequent to installation, high voltage damage is usually the result of a power surge. These high voltages may destroy integrated circuits, thus requiring expensive and tedious repairs on fully manufactured devices which could have been avoided by providing a mechanism for dissipation of the high voltage on the integrated circuit. This problem is particularly acute in MOS (metal oxide semiconductor) field effect transistor type integrated circuits.

Techniques presently used to build input/output structures on VLSI chips include a layout technique referred to as ladder structures. A ladder structure is formed by dividing a "wide" device into multiple parallel devices. During and ESD event, an N-channel device is susceptible to damage. This is particularly true if the source/drain of the N-channel device is formed as an LDD (lightly doped drain). The N-channel device is even more susceptible to damage if the diffusions are reacted with $TiSi_2$. One phenomenon reported to be causing low failure thresholds is that all of the devices that are in parallel, to form the one large device, do not conduct the large current required to dissipate the power of an ESD strike. Very high power being dissipated in a small area causes "current crowding" and a very real possibility that an N-channel device will be damaged.

Therefore, it is highly desirable to provide an input protection structure that protects an integrated circuit from damage caused by electrostatic discharge events.

SUMMARY OF THE INVENTION

The described embodiments of the present invention provide an input protection device for improving I/O electrostatic discharge ESD tolerance. The present invention protects a selected device by providing a sufficient potential difference between the substrate and the source of the selected device to protect it against damage from an electrostatic discharge. In one embodiment of the invention, a resistor is placed between the substrate and the internal $V_{SS}$ connection. All substrate contacts have to be removed for internal $V_{SS}$ busses to maintain a predetermined resistance between the substrate and the internal $V_{SS}$.

In other embodiments of the invention, an active device is placed between the substrate and the internal $V_{SS}$ connection. As with the above described embodiment, all substrate contacts have to be removed for internal $V_{SS}$ busses to be maintained at a predetermined resistance between the substrate and $V_{SS}$. The active device presents a high impedance when off and is very conductive when powered on.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

Figure 1:
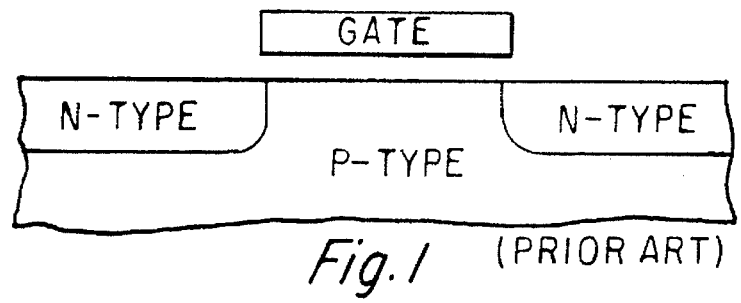
FIG. 1 is a side view schematic diagram of a typical N-channel MOS device.

A "bipolar effect" is the phenomenon that allows high currents to be discharged without too much power being dissipated. FIG. 1 shows a typical N-channel MOS device. In normal operation, the device operates in a standard MOS mode. When the gate reaches a $V_{GS}$ (voltage gate-to-source) greater than the threshold voltage $V_T$ of the device, current will flow between the drain and source in the presence of potential difference between the drain and source. During an ESD strike, a very high voltage appears at one of the diffusions which generates substrate current from the high potential diffusion. If this current is high enough to locally raise the substrate above the lower potential diffusion by a $V_{BE}$ (voltage base-to-emitter), the device will conduct current in a bipolar NPN mode.

The bipolar device that exists as an NPN is referred to as a lateral bipolar. Like intentionally active bipolars, when the lateral bipolar conducts high enough currents it will go into a breakdown condition and the impedance of the device will be very low and the potential across the diffusions will be limited to $V_{SB}$, the snap back potential.

The parasitic devices that combine to form an I/O are typically laid out in a ladder structure that includes multiple parallel devices. The key to achieving high ESD immunity is to ensure that all of the parallel devices enter into the bipolar breakdown mode. On chips having a floating or charge pumped substrate, such as DRAMs, this is not difficult since small amounts of substrate current raise the substrate potential and turn on all of the lateral bipolars similarly. The problem arises when chips use a grounded substrate, such as in logic chips or EPROMs (erasable programmable read only memories).

When a chip uses a grounded substrate, the source of the N-channel device being zapped (struck with an ESD event) is tied closely to the substrate. A grounded substrate makes it difficult to bias the substrate higher than normal. An ESD event causes local substrate biasing resulting in non-uniform current flow through all of the parallel devices. The present invention teaches a device and method for creating a sufficient potential difference between the substrate and the sources of N-channel devices for uniform current flow through all of the parallel devices.

Figure 2:
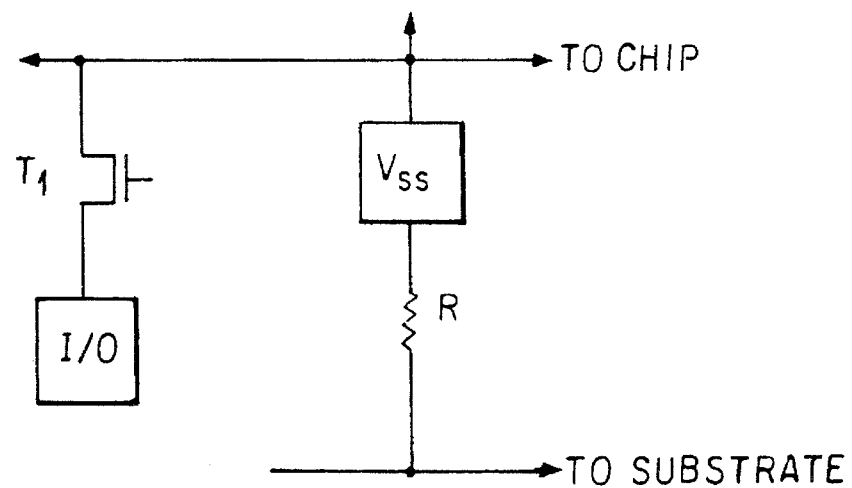
FIG. 2 is a schematic diagram of one embodiment of the present invention.

In one embodiment of the invention, shown in FIG. 2, $T_1$ is the device to be protected. One of a source and drain of $T_1$ is connected to an I/O bond pad. The other of the source and drain of $T_1$ is coupled to the $V_{SS}$ bus. A resistor R is placed between the substrate and the internal $V_{SS}$ bus. There is also a $V_{SS}$ bond pad for connecting an external $V_{SS}$ to the internal $V_{SS}$ bus. All substrate contacts are removed from internal $V_{SS}$ busses to maintain a predetermined resistance between the substrate and $V_{SS}$. Latchup concerns are handled by maintaining very good NWell contacts at the edges where SCRs (not shown) are formed. One method to place the resistor between the substrate and the $V_{SS}$ bus is to use an 85/85, or outer moisture protection ring, to connect a metal bus to the substrate. The line labeled "to substrate" may be the 85/85 ring. Next, a simple resistor, say NMoat, may be placed between the $V_{SS}$ bond pad and the 85/85 ring. Care must be taken not to use this bus for high current conditions other than ESD events. Intentional SCRs (not shown) to protect input devices may use this bus if the resistor is not too large. This scheme may not be desirable or necessary when non-EPI or single crystal starting material is used.

An active device may also be used to significantly increase the impedance and to provide more latchup immunity than is available with a fixed resistor. An active device offers the advantages of having a high impedance when it is off and being very conductive when powered on. In the embodiment of the invention shown in FIG. 3, an active device $T_2$ is used in lieu of resistor R in the device of FIG. 2. A gate of $T_2$ is connected to $V_{CC}$. One of a source and drain of $T_2$ is connected to the substrate and the other of the source and drain of $T_2$ is coupled to the internal $V_{SS}$ connection. $T_2$ should have a size sufficient to maintain "good" latchup immunity while maintaining sufficient impedance during an ESD event.

Figure 3:
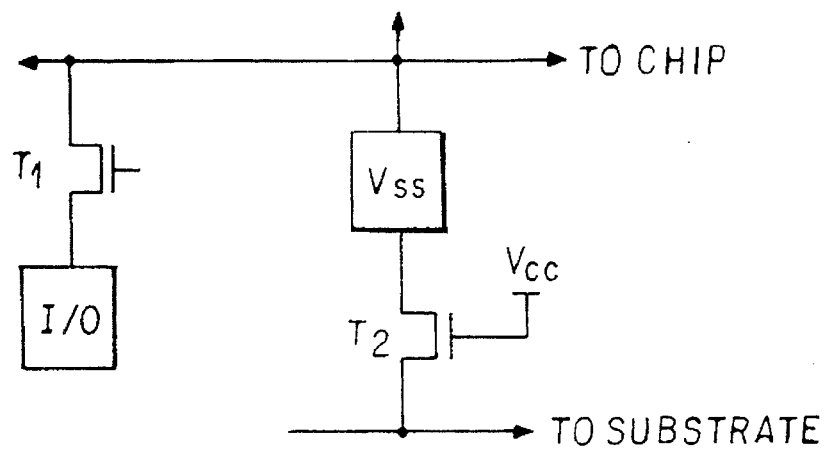
FIG. 3 is a schematic diagram of another embodiment of the present invention.
Figure 4:
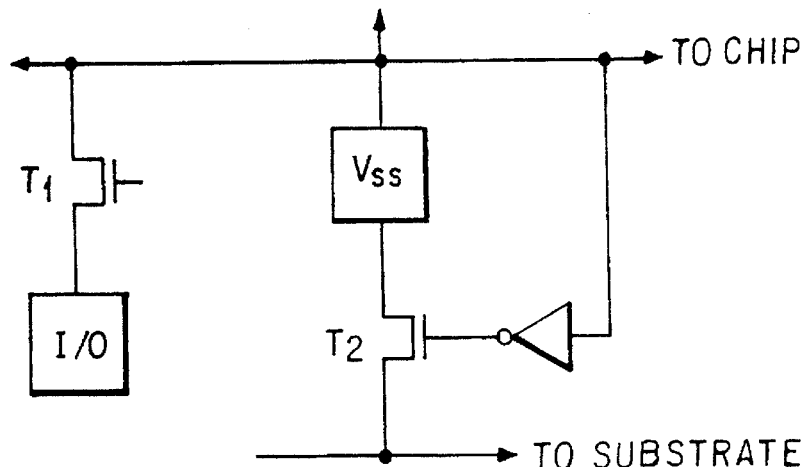
FIG. 4 is a schematic diagram of yet another embodiment of the present invention.

The embodiment of the invention shown in FIG. 4 is a modification of FIG. 3. In FIG. 4, the gate of $T_2$ is connected to the output of an inverter. The input of the inverter is coupled to the internal $V_{SS}$ bus.

Figure 5:
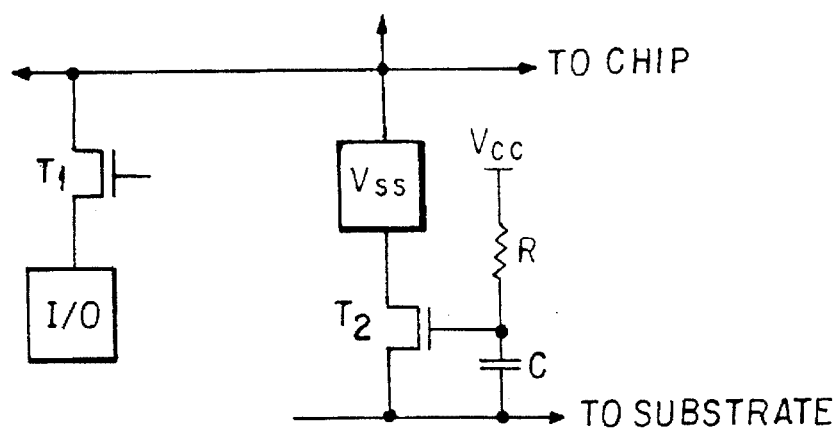
FIG. 5 is a schematic diagram of still yet another embodiment of the present invention.
Figure 6:
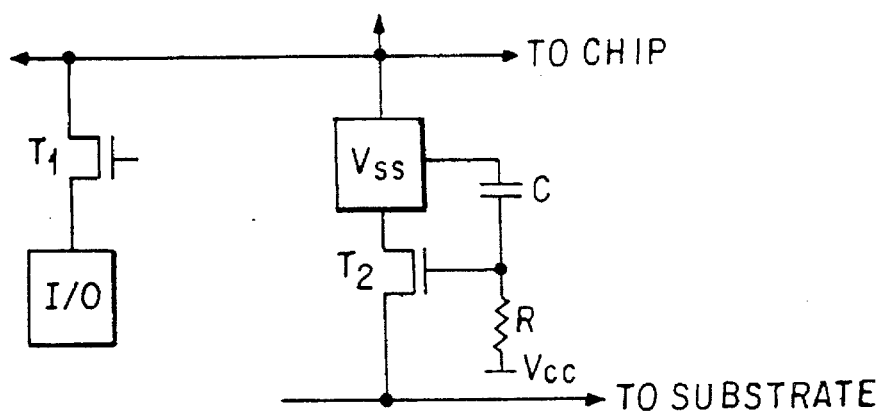
FIG. 6 is a schematic diagram of yet still another embodiment of the present invention.

In the embodiment of the invention shown in FIG. 5, the gate of $T_2$ is coupled to ground as $V_{CC}$ rises at a fast rate. The gate will rise to $V_{CC}$ after a certain length of time. The value of resistor R may be selected for an appropriate rise time. FIG. 6 shows an alternative schematic diagram for the embodiment of the invention shown in FIG. 5.

While specific embodiments of the present invention are disclosed herein, they are not to be construed in a limiting sense. For example, the reference to an active device should not be limited to an N-channel implementation. An alternative circuit technique could use a P-channel device. The gate of the P-channel device would have to be pumped to a negative value. Another embodiment might include a resistor in parallel with the transistor to facilitate the substrate conducting some small amount of current. In addition, the described embodiments are utilized in conjunction with integrated circuitry. The present invention is not limited to integrated circuitry in any way and may advantageously provide over-voltage protection for discrete type devices. It is therefore contemplated that the appended claims will cover any such modifications or embodiments as fall within the true scope of the invention.

I claim:

1. A semiconductor protection circuit comprising:

a lightly doped region of a first conductivity type at a face of a substrate;

a field effect transistor, formed in said lightly doped region and having heavily doped source and drain terminals of a second conductivity type;

a bond pad coupled to one of said source and drain terminals;

an internal reference bus coupled to another of said source and drain terminals;

an external reference bus coupled to said substrate; and a resistive device for coupling said internal reference bus to said external reference bus.

2. A circuit according to claim 1 further comprising a first heavily doped region of a first conductivity type for coupling said lightly doped region to said external reference bus.

3. A circuit according to claim 2 wherein said internal reference bus is not directly connected to said lightly doped region by a second heavily doped region of said first conductivity type.

* * * * *